(12) United States Patent
Chen et al.

(10) Patent No.: US 7,507,599 B1
(45) Date of Patent: Mar. 24, 2009

(54) ZNX (X=S, SE, TE) QUANTUM DOT PREPARATION METHOD

(75) Inventors: Hsueh-Shih Chen, Hsinchu (TW); Gwo-Yang Chang, Jiali Township, Tainan County (TW); Chien-Ming Chen, Yangmei Township, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 264 days.

(21) Appl. No.: 11/007,882

(22) Filed: Dec. 9, 2004

(30) Foreign Application Priority Data

Dec. 11, 2003 (TW) .............................. 92134997 A

(51) Int. Cl.
  *H01L 21/02* (2006.01)
  *H01L 33/00* (2006.01)
(52) U.S. Cl. ........................... 438/63; 438/85; 438/104; 977/774; 977/811; 977/896; 257/13

(58) Field of Classification Search .................... 438/63
See application file for complete search history.

(56) References Cited

U.S. PATENT DOCUMENTS 7,192,850 B2 * 3/2007 Chen et al. .................. 438/479

OTHER PUBLICATIONS

Chen et al, "Colloidal ZnSe . . . ZnO" J.Phys.Chem.B Oct. 8, 2004 108, pp. 17119-17123.*

* cited by examiner

*Primary Examiner*—Jerome Jackson, Jr.
(74) *Attorney, Agent, or Firm*—Thomas, Kayden, Horstemeyer & Risley

(57) ABSTRACT

A ZnX, X is S, Se, Te or a combination thereof, quantum dot preparation method. This method comprises the following steps: dissolving S powder, Se powder, Te powder or a combination thereof into an organic alkali to form a first complex solution; dissolving ZnO into an organic acid and a co-solvent to form a second complex solution; and mixing the first complex solution and the second complex solution to obtain the ZnX quantum dot.

14 Claims, 11 Drawing Sheets

ZNX (X=S, SE, TE) QUANTUM DOT PREPARATION METHOD

BACKGROUND

The invention relates to a quantum dot preparation method, and more particularly to a ZnX, where X is S, Se, Te or a combination thereof, quantum dot preparation method.

ZnX quantum dot are semiconductor luminescent materials and usually used as phosphors. The energy gaps of ZnTe, ZnSe and ZnS are 2.39 eV, 2.82 eV and 3.68 eV respectively, and range from UV to visible light. By different concentrations or/and doping, the luminescent wavelengths of the phosphors can be tuned to predetermined wavelengths.

Conventional phosphors are prepared by high temperature treatment, such that phosphors grains grow and difficult to maintain at nanoscale (grain size<100 nm) or quantum dot (grain size<10 nm). From theoretical calculation and research, the luminescent efficiency of quantum dot is higher than bulk type, such that usage of phosphors has decreased, as does cost. Energy gap and luminescent wavelength of phosphors also can change with use of different grain sizes.

Small particle ZnX phosphors are usually prepared in aqua phase. For example, zinc salts such as ammonium zinc and surfactant are immersed in water, and NaS aqua solution is added drop by drop to obtain ZnS nano-particles. The resulting ZnS nano-particles, however, exhibit poor crystallization, frequent defects and low luminescent efficiency.

Recently, inorganic nano-particles have been formed in non-aqua phase at about 200~400° C. A method for preparing ZnSe is described in "Bright UV-Blue Luminescent Colloidal ZnSe Nanocrystals", Journal of Physical Chemistry B volume 102, number 19, 1998, issued to Margaret A. Hines and Philippe Guyot-Sionnest. In this method, diethyl zinc, hexadecylamine (HDA), trioctylphosphine (TOP) and Se powders are combined and heated to 300° C. to obtain ZnSe quantum dot. Although the ZnSe quantum dot have good crystallization, high luminescent efficiency and narrow particle distribution, diethyl zinc is flammable, unstable and expensive, so this method is not suitable for industry.

To resolve the described problems and obtain high luminescent efficiency ZnX quantum dot, there is a need for a better ZnX preparation method.

SUMMARY

Accordingly, the embodiments provide a ZnX, where X is S, Se, Te or a combination thereof, quantum dot preparation method.

This method comprises the following steps: dissolving S powders, Se powders, Te powders or a combination thereof into an organic alkali to form a first complex solution; dissolving ZnO into an organic acid and a co-solvent to form a second complex solution; and mixing the first complex solution and the second complex solution to obtain the ZnX quantum dot.

DESCRIPTION OF THE DRAWINGS

The invention can be more fully understood by reading the subsequent detailed description and examples with references made to the accompanying drawings, wherein.

DETAILED DESCRIPTION

The embodiments provide a ZnX, where X is S, Se, Te or a combination thereof, quantum dot preparation method. Due to the danger and cost of diethyl zinc, ZnO is used instead of diethyl zinc in the embodiments. Furthermore, in order to obtain well-crystallized ZnX quantum, the ZnX of the embodiments is prepared in a high temperature non-aqua environment.

First, S powder, Se powder, Te powder or combinations thereof are put in vacuum environment to remove moisture. These powder is put in inert gas and organic alkali and are treated by ultrasonic for 30 mins to obtain organic alkali complexes. The organic alkali is tri-methylphosphine (TMP), tri-butylphosphine (TBP) or tri-octylphosphine (TOP).

ZnO is put in inert gas and heated to 120° C. to remove moisture. After the ZnO cools, organic acid and co-solvent are added and heated again to form the ZnO, organic acid and co-solvent complexes.

The organic acid comprises carboxylic acids, sulfinic acids, aliphatic compounds, alkyl phosphonic acids, lipophilic phosphines or lipophilic phosphine oxides. The carboxylic acids comprise dodecanoic acid, stearic acid or isocaproic acid. The aliphatic compounds comprise aliphatic acids, aliphatic acid esters, aliphatic acid alcohols or aliohatic acid aldehydes. The alkyl phosphonic acids comprise hexylphosphonic acid (HPA), tetra-decylphosphonic acid (TDPA) or octa-decylphosphonic acid (ODPA).

The co-solvent comprises lipophilic phosphines, lipophilic phosphine oxides, amines, alcohols or other solvents. The lipophilic phosphines comprise tri-butylphosphine (TBP), tri-octylphosphine (TOP) or tri-methylphosphine (TMP). The lipophilic phosphine oxides comprise tri-octylphosphine oxide (TOPO). The amines comprise $C_{1-30}$ alkylamine. The other solvents are lecithin, N,N-dimethyl-N-alkyl-N-methyl-carboxylate, N,N-dialkylamidoalkylenecarboxylic slats, N,N,N-trialkyl-N-sulfonenebetaine, N,N-dialkyl-N, N-bispolyoxyethylenesulfatebetaine or polyoxyvinylalkylether.

Figure 1:
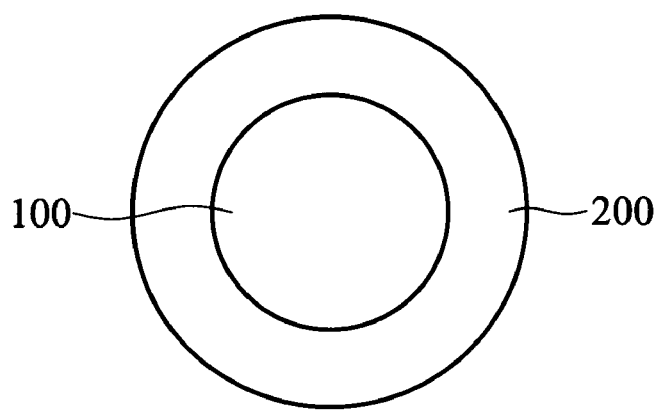
FIG. 1 is a schematic illustrating the ZnX quantum dot and organic molecules structure of the embodiments.

The two solutions are mixed above 120° C. to obtain ZnX quantum dot. The ZnX quantum dot are synthesized in organic solvent, so the surface of each ZnX quantum dot is covered with organic molecules naturally to form a core/shell structure as shown in FIG. 1. The organic shell 200 improves the ZnX quantum dot 100 stability.

Furthermore, different dopant and dopant concentrations can be added into the system, two or three X types can be used in the system, and/or different X ratios can all tune the crystal lattice of the ZnX quantum dot to control luminescent wavelength and efficiency.

EXAMPLE 1

ZnSe Preparation 0.3048 g Se powder was put in a vacuum environment to remove moisture, and inert gas was injected from oxidation. 5 ml tri-octylphosphine (TOP) was added and treated by ultrasonic for 30 mins to obtain a colorless TOPSe complex solution.

0.81 g ZnO was put in a three-necked bottle and heated to 120° C. in inert gas to remove moisture. After ZnO cooling to room temperature, 2 g hexadecylamine (HDA) and 2 g stearic acid (SA) were added and heated to 150° C. for 20 mins to obtain a transparent solution.

The ZnO solution was heated to 300° C., and the TOPSe solution was added to form 1~20 nm ZnSe nano-particles by controlling reaction time. The longer reaction time was, the bigger ZnSe particles were. The smaller particle size was, the larger energy gap was and the blue shift in spectrum was more obvious.

After this reaction, the solution color was yellow. After distilling by methanol/toluene, the product was stored in toluene.

ZnSe Identification

Figure 2:
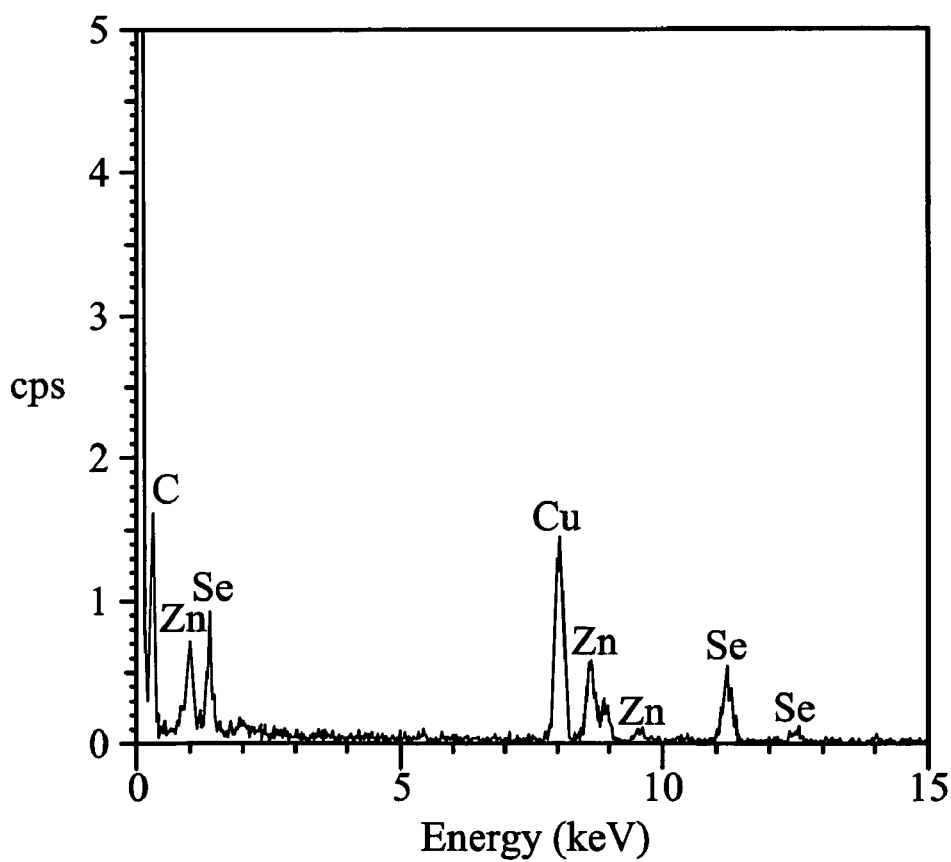
FIG. 2 is a ZnSe quantum dot EDS of example 1.

The product sample was identified by energy dispersive spectrometer (EDS), X-ray diffraction (XRD) meter, transmission electron microscopy (TEM), absorption spectrum and PL spectrum. The result is disclosed as follows:

FIG. 2 is the EDS of the product sample. After analysis, this EDS shows the product sample comprising Zn, Se, C and P elements.

Figure 3:
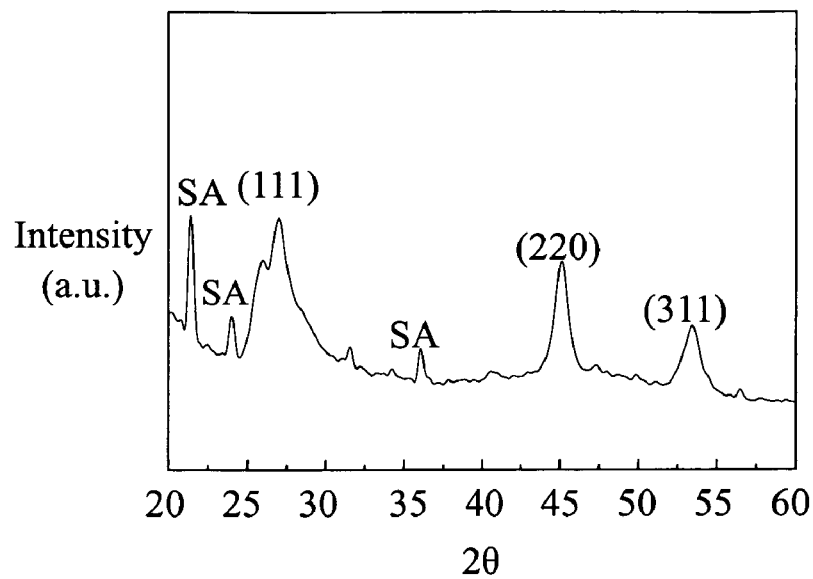
FIG. 3 is a ZnSe quantum dot and stearic acid XRD of example 1.
Figure 4:
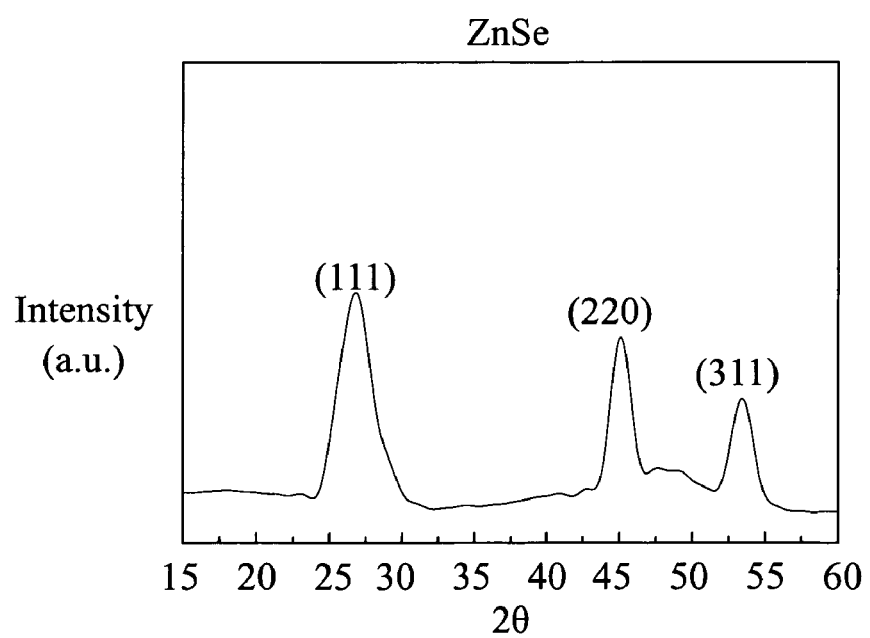
FIG. 4 is a ZnSe quantum dot XRD of example 1.

FIG. 3 is the XRD of the product sample. It shows that the product sample comprises ZnSe diffraction peak and stearic acid diffraction peak, with the product sample indeed comprising ZnSe and stearic acid. If the stearic acid is removed by hot methanol and ultrasonics, the XRD would only comprise ZnSe diffraction peak, as shown in FIG. 4.

Figure 5:
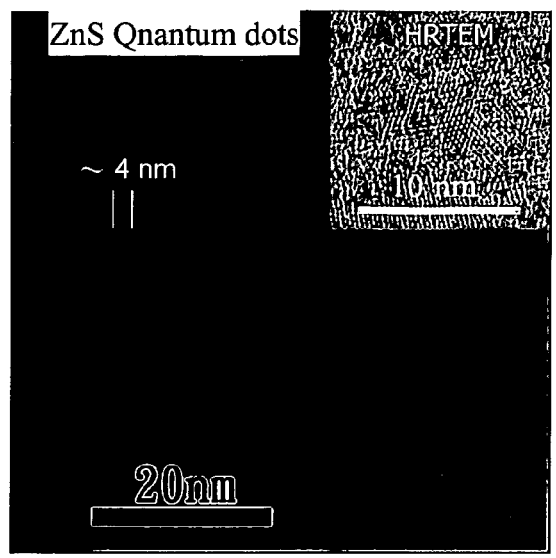
FIG. 5 is a ZnSe quantum dot TEM picture of example 1.

FIG. 5 is the TEM picture of the product sample, showing that the product sample particle size was about 4 nm, indicating particles to be quantum dot. In this TEM picture, it can be seen that each particle surface is covered by a film, exhibiting a core/shell structure. It is considered as a ZnSe/organic substance structure.

Figure 6:
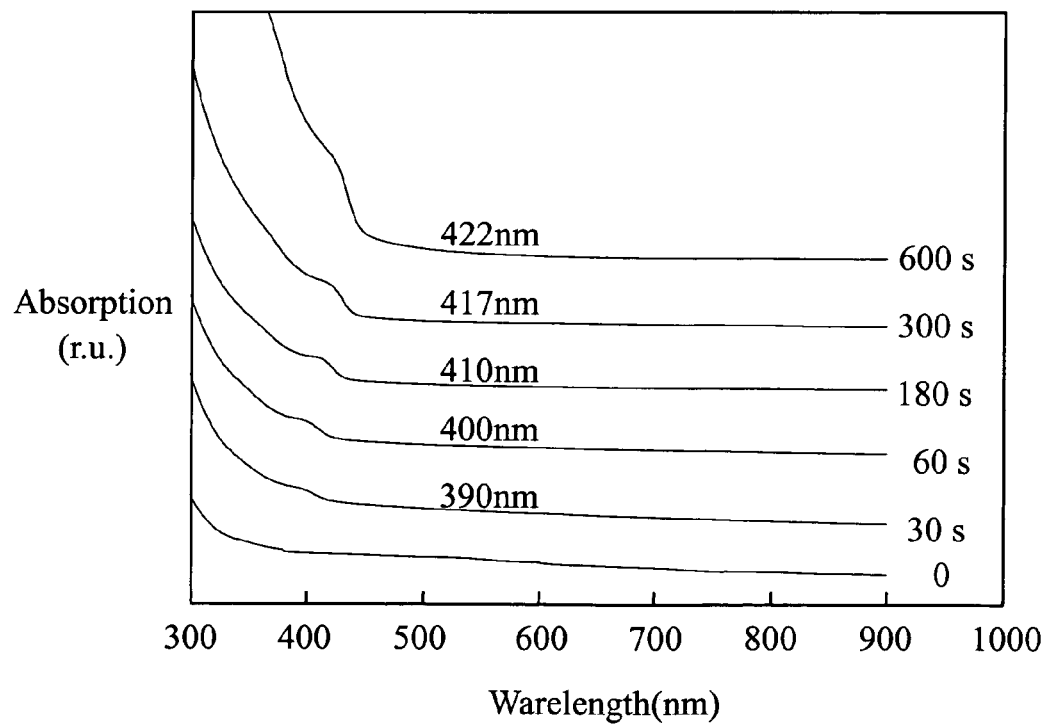
FIG. 6 is a ZnSe quantum dot absorption spectrum of different reaction times of example 1.
Figure 7:
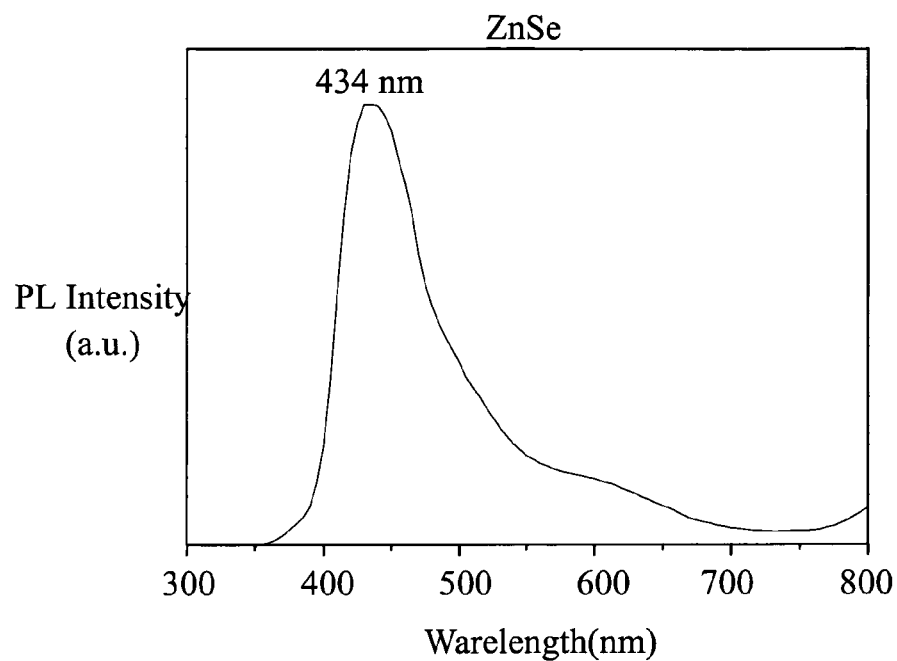
FIG. 7 is a blue ZnSe quantum dot PL spectrum of example 1.
Figure 8:
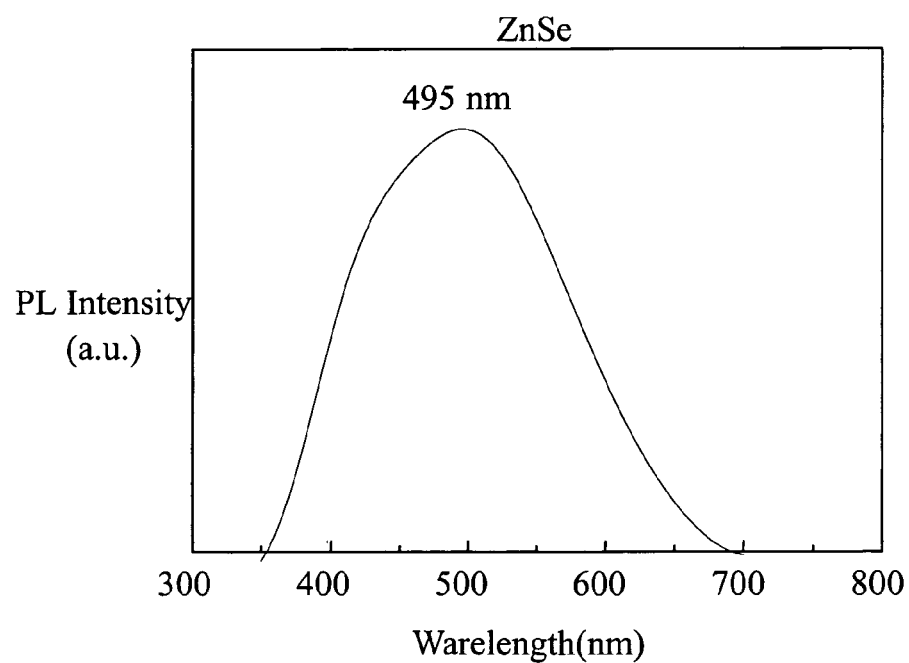
FIG. 8 is a blue-green ZnSe quantum dot PL spectrum of example 1.
Figure 9:
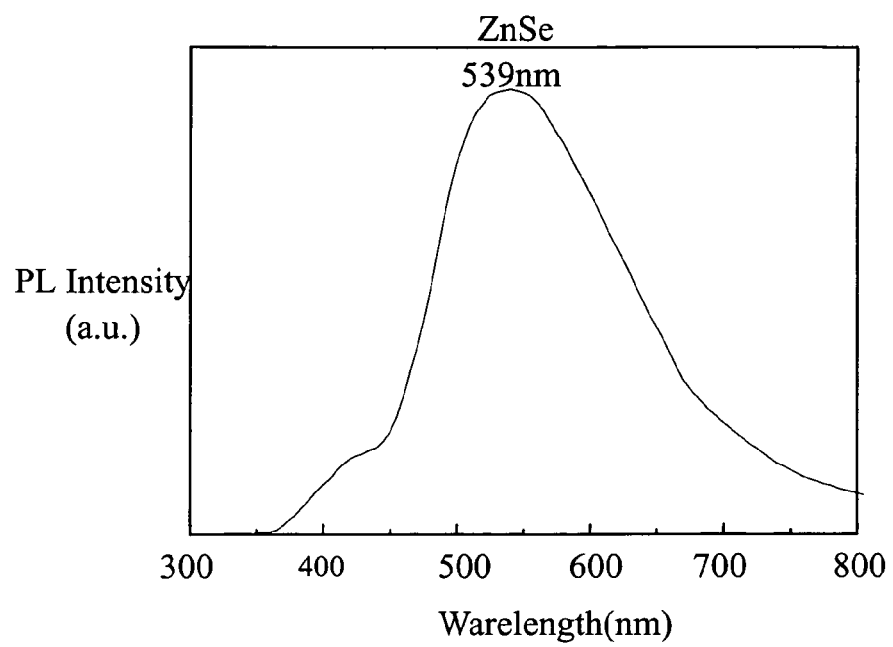
FIG. 9 is a green ZnSe quantum dot PL spectrum of example 1.
Figure 10:
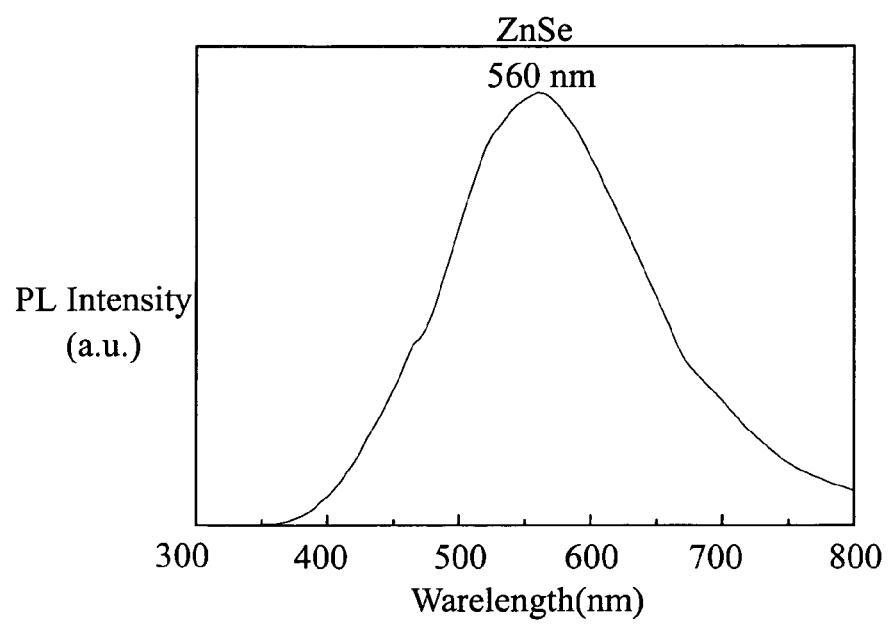
FIG. 10 is a yellow ZnSe quantum dot PL spectrum of example 1.
Figure 11:
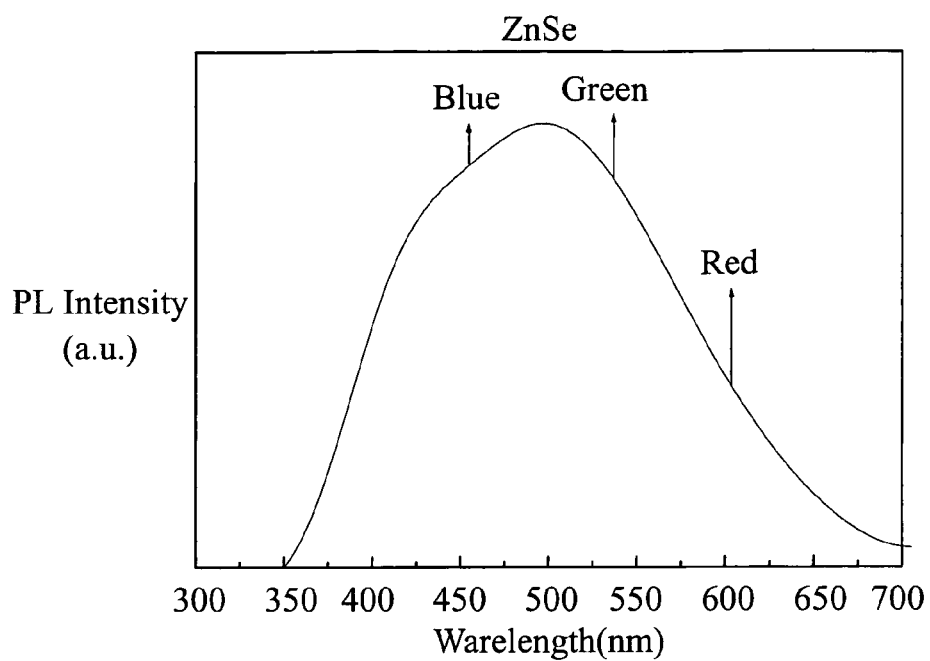
FIG. 11 is a white ZnSe quantum dot PL spectrum of example 1.

FIG. 6 is the absorption spectrum under the product samples where different reaction times. The absorption peaks in the 350~430 nm show a conventional ZnSe absorption spectrum. The absorption spectrum shows that shorter reaction time produces shorter absorption wavelength and smaller particle size was, blue shift was more obvious.

FIGS. 7~11 are PL spectrums of product samples of different precursors. PL peaks are at 400~700 nm. The samples luminesced blue, blue-green, green, yellow and white respectively.

Figure 12:
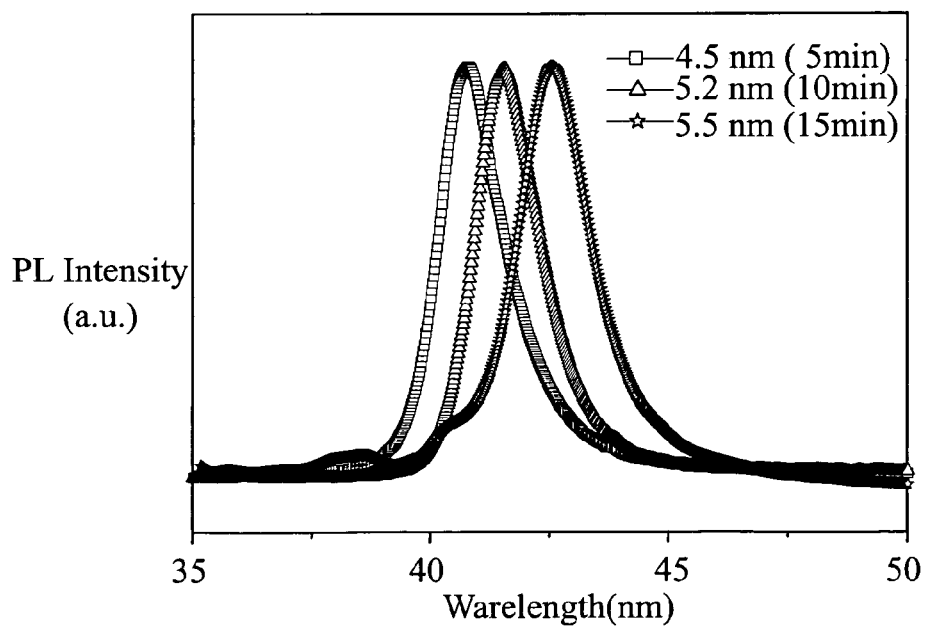
FIG. 12 is a ZnSe quantum dot PL spectrum of different reaction times of example 1.

FIG. 12 is the PL spectrum of the product samples of different reaction times, showing shorter reaction time providing shorter absorption wavelength. The absorption spectrum shows that shorter reaction time produces shorter absorption wavelength and smaller particle size was, blue shift was more obvious.

According to the identification, ZnSe quantum dot were obtained by the present invention and covered by organic substance. Different size quantum dot had different absorption and emitting wavelengths, and the smaller quantum dot were, the shorter absorption and emitting wavelengths of the quantum dot was. Quantum dot with different absorption and emitting wavelengths is obtained with use of different precursors.

EXAMPLE 2

ZnS Preparation 0.0163 g S powder was put in a vacuum environment to remove moisture, and inert gas was injected from oxidation. 0.5 ml tri-octylphosphine (TOP) was added and treated by ultrasonic for 30 mins to obtain colorless TOPS complex solution.

0.0405 g ZnO was put in a three-necked bottle and heated to 120° C. in inert gas to remove moisture. After ZnO cooling to room temperature, 0.3673 g tri-octylphosphine oxide (TOPO) and 11.4 g stearic acid (SA) were added and heated to 150° C. for 20 mins to obtain a transparent solution.

The ZnO solution was heated to 300° C., and the TOPS solution was added to form 1~20 nm ZnS nano-particles by controlling reaction time. The longer reaction time was, the bigger ZnS particles were. The smaller particle size was, the larger energy gap was and the blue shift in spectrum was more obvious.

ZnSe Identification

Figure 13:
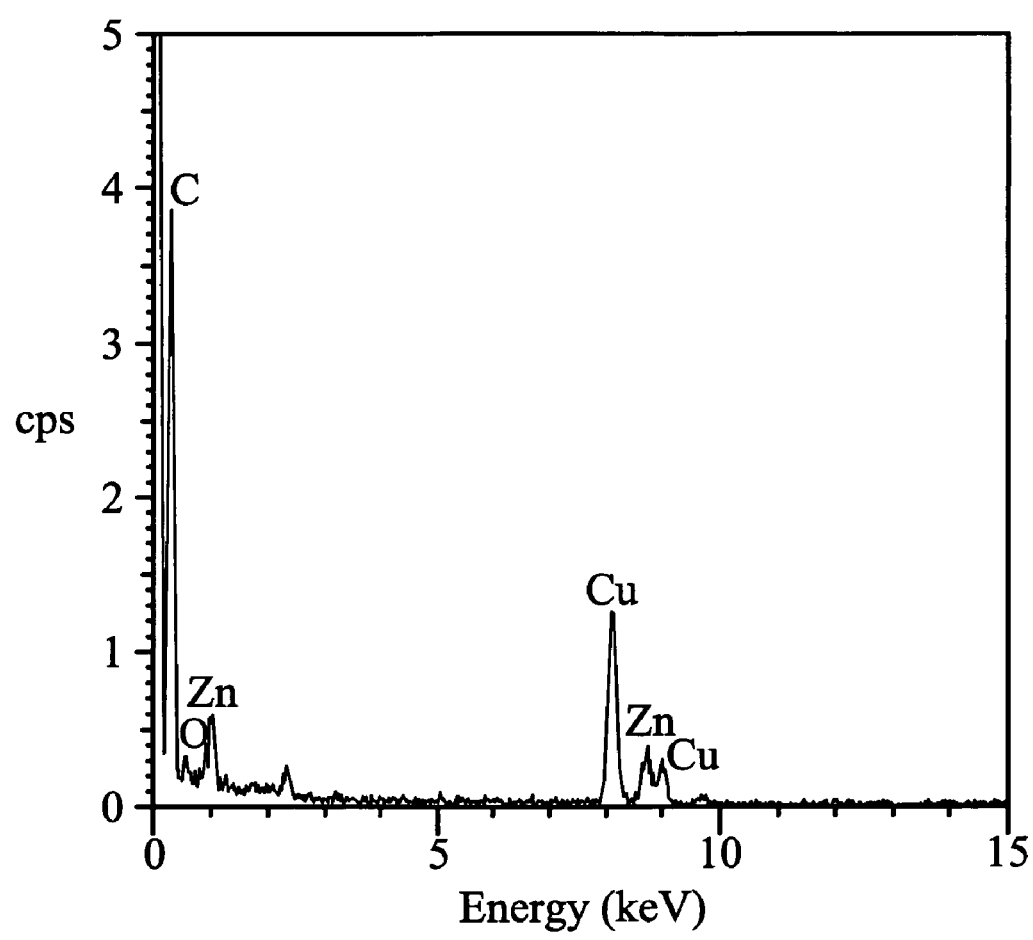
FIG. 13 is a ZnS quantum dot EDS of example 2.

The product sample was identified by energy dispersive spectrometer (EDS), transmission electron microscopy (TEM), absorption spectrum and PL spectrum. The result is disclosed as follows:

FIG. 13 is the EDS of the product sample. After analysis, this EDS shows the product sample comprising Zn, S, C and P elements.

Figure 14:
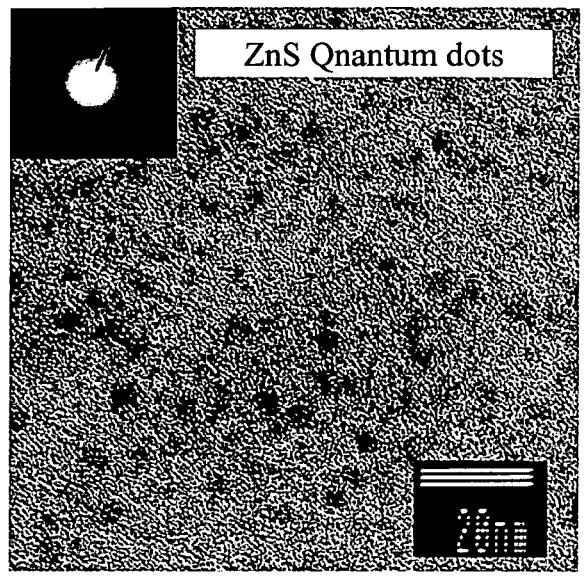
FIG. 14 is a ZnS quantum dot TEM picture of example 2.

FIG. 14 is the TEM picture of the product sample, showing that the product sample particle size was about 4 nm, indicating particles to be quantum dot. In this TEM picture, it can be seen that each particle surface is covered by a film, exhibiting a core/shell structure. It is considered as a ZnS/organic substance structure.

Figure 15:
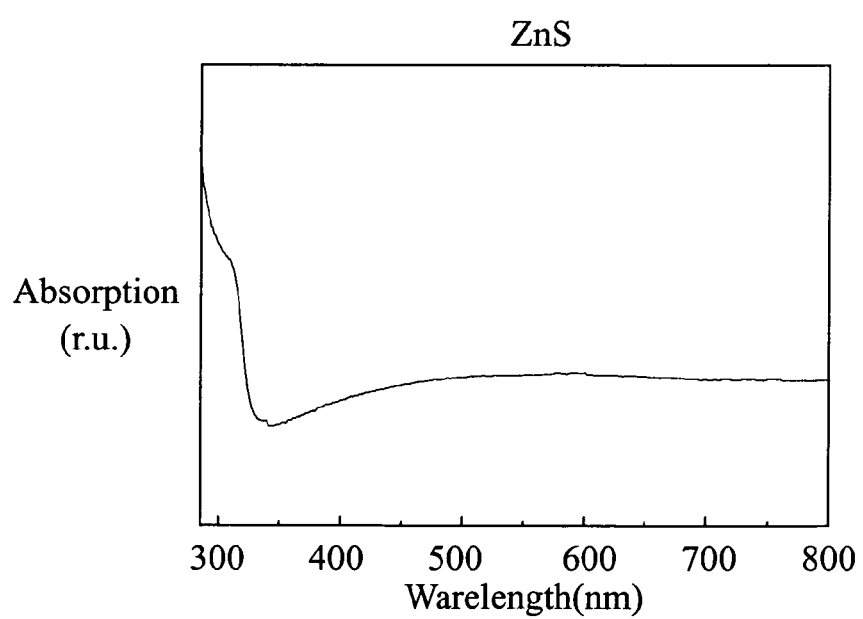
FIG. 15 is a ZnS quantum dot absorption spectrum of example 2.

FIG. 15 is the absorption spectrum under the product sample The absorption peaks in 300~400 nm, show a conventional ZnS absorption spectrum.

Figure 16:
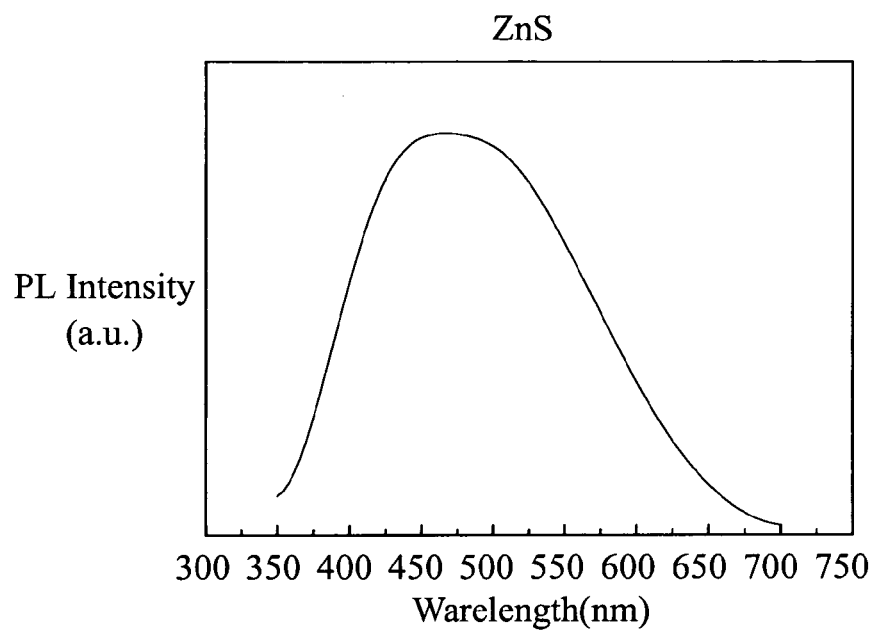
FIG. 16 is a ZnS quantum dot PL spectrum of example 2.

FIG. 16 is PL spectrums of the product sample. The PL peak is in 350~700 nm, show a conventional ZnS PL spectrum.

According to the above identification, ZnS quantum dot covered by organic substance is obtained.

EXAMPLE 3

ZnTe Preparation 1.276 g Te powder was put in a vacuum environment to remove moisture, and inert gas was injected from oxidation. 15 ml tri-octylphosphine (TOP) was added and the solution was treated by the ultrasonic for 30 mins to obtain a green TOPTe complex solution.

1.215 g ZnO was put in a three-necked bottle and heated to 120° C. in inert gas to remove moisture. After ZnO cooling to room temperature, 23.2 g tri-octylphosphine oxide (TOPO) and 1.0016 g stearic acid (SA) were added and heated to 150° C. for 20 mins to obtain a transparent solution.

The ZnO solution was heated to 300° C., and the TOPTe solution was added to form 1~20 nm ZnTe nano-particles by controlling reaction time. The longer reaction time was, the bigger ZnSe particles are. The smaller particle size was, the larger energy gap is and the blue shift in spectrum was more obvious.

ZnTe Identification

Figure 17:
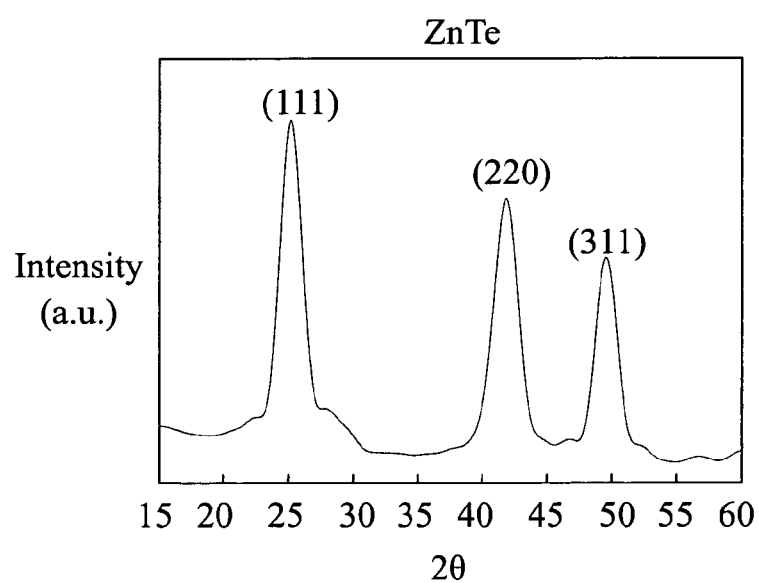
FIG. 17 is a ZnTe quantum dot XRD of example 3.

The product sample was identified by X-ray diffraction (XRD) meter, absorption spectrum and PL spectrum. The result is disclosed as follows:

FIG. 17 is the XRD of the product sample. It shows that the product sample comprises ZnTe diffraction peak, so the ZnTe is obtained indeed.

Figure 18:
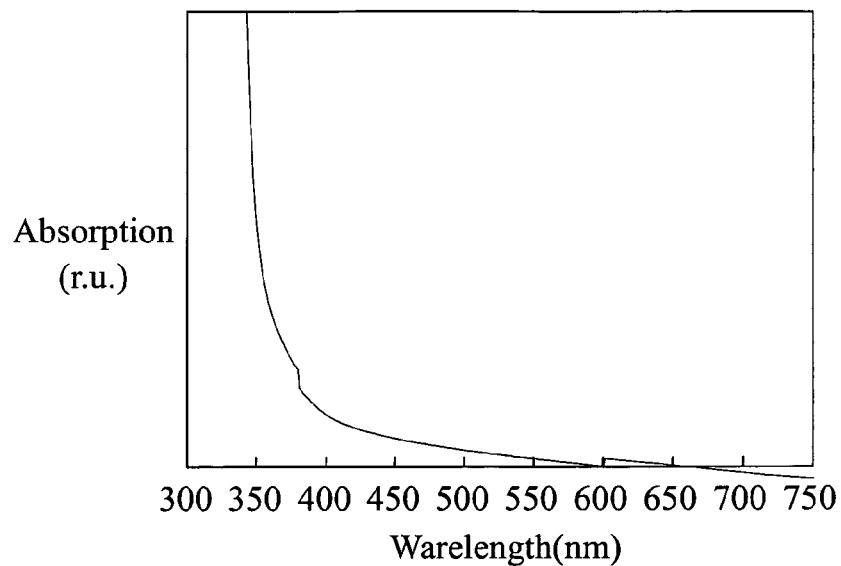
FIG. 18 is a ZnTe quantum dot absorption spectrum of example 3.

FIG. 18 is the absorption spectrum of the product sample. The absorption peak of 300~400 nm is the conventional ZnTe absorption spectrum.

Figure 19:
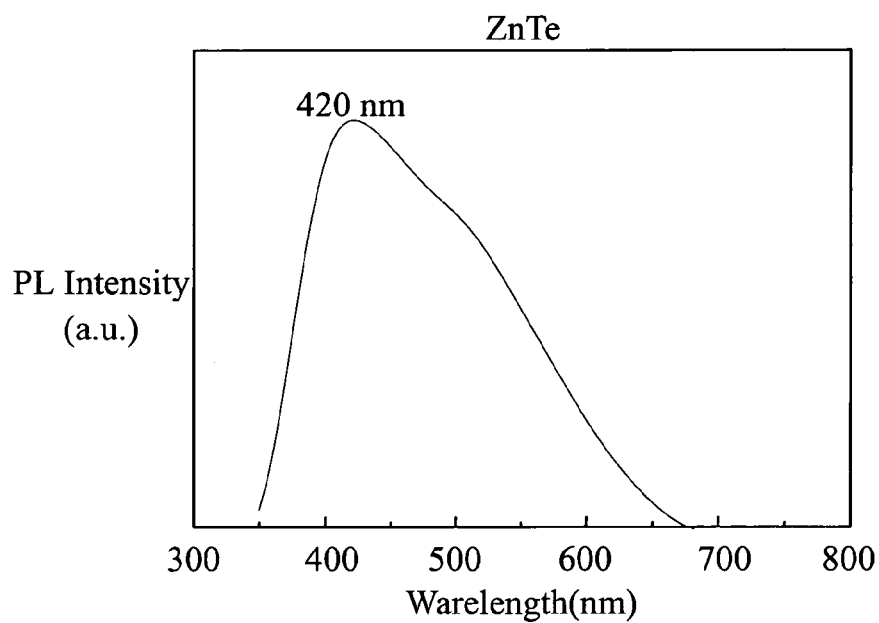
FIG. 19 is a ZnTe quantum dot PL spectrum of example 3.

FIG. 19 is PL spectrums of the product sample. The PL peaks of 350~700 nm is the conventional ZnTe PL spectrum.

Figure 20:
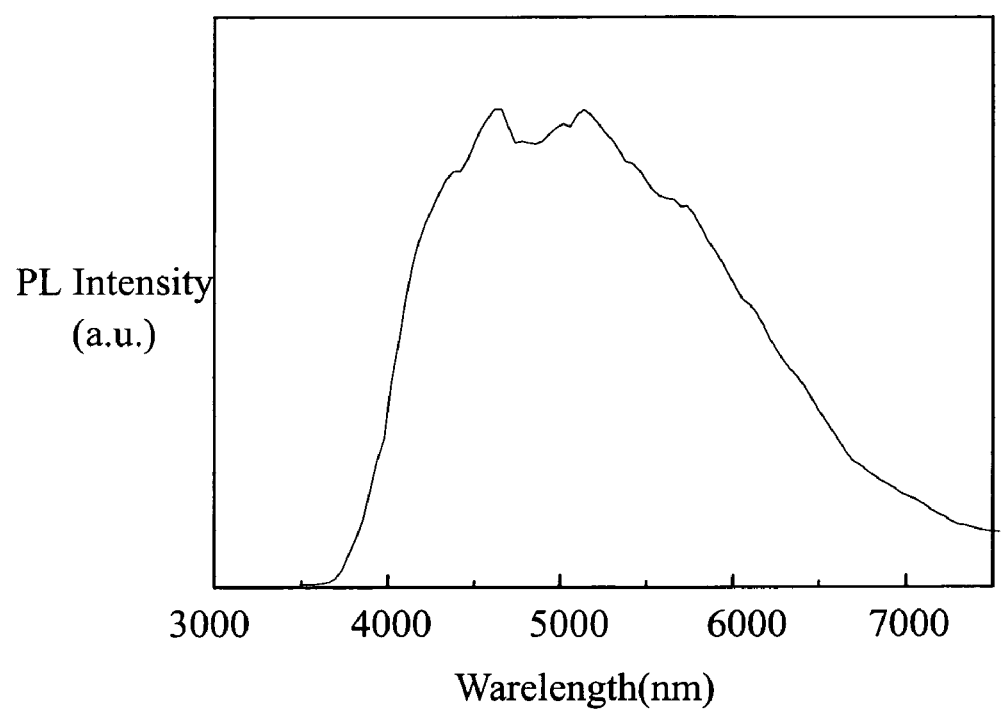
FIG. 20 is a white ZnTe quantum dot PL spectrum of example 3.

FIG. 20 was PL spectrums of the product sample. The PL peaks of 350~750 nm is the conventional white ZnTe PL spectrum.

According to the above identification, ZnTe quantum dot is obtained.

What is claimed is:

1. A ZnX quantum dot preparation method, where X is S, Se, Te or a combination thereof, comprising:
    dissolving S powder, Se powder, Te powder or a combination thereof into an organic alkali to form a first complex solution;
    dissolving ZnO into an organic acid and a co-solvent to form a second complex solution; and
    mixing the first complex solution and the second complex solution to obtain ZnX quantum dot.

2. The ZnX quantum dot preparation method as claimed in claim 1, wherein the organic alkali comprises tri-methylphosphine (TMP), tri-butylphosphine (TBP) or tri-octylphosphine (TOP).

3. The ZnX quantum dot preparation method as claimed in claim 1, wherein the organic acid comprises carboxylic acids, sulfinic acids, aliphatic compounds, alkyl phosphonic acids, lipophilic phosphines or lipophilic phosphine oxides.

4. The ZnX quantum dot preparation method as claimed in claim 3, wherein the carboxylic acids comprise dodecanoic acid, stearic acid or isocaproic acid.

5. The ZnX quantum dot preparation method as claimed in claim 3, wherein the aliphatic compounds comprise aliphatic acids, aliphatic acid esters, aliphatic acid alcohols or aliohatic acid aldehydes.

6. The ZnX quantum dot preparation method as claimed in claim 3, wherein the alkyl phosphonic acids comprise hexylphosphonic acid (HPA), tetra-decylphosphonic acid (TDPA) or octa-decylphosphonic acid (ODPA).

7. The ZnX quantum dot preparation method as claimed in claim 1, wherein the co-solvent comprises lipophilic phosphines, lipophilic phosphine oxides, amines or alcohols.

8. The ZnX quantum dot preparation method as claimed in claim 7, wherein the lipophilic phosphines comprise tri-butylphosphine (TBP), tri-octylphosphine (TOP) or tri-methylphosphine (TMP).

9. The ZnX quantum dot preparation method as claimed in claim 7, wherein the lipophilic phosphine oxides comprise tri-octylphosphine oxide (TOPO).

10. The ZnX quantum dot preparation method as claimed in claim 7, wherein the amines comprise $C_{1\sim30}$ alkylamine.

11. The ZnX quantum dot preparation method as claimed in claim 1, wherein the co-solvent comprises lecithin, N,N-dimethyl-N-alkyl-N-methylcarboxylate, N,N-dialkylamidoalkylenecarboxylic slats, N,N,N-trialkyl-N-sulfonenebetaine, N,N-dialkyl-N, N-bispolyoxyethylenesulfatebetaine and polyoxyvinylalkylether.

12. A ZnS quantum dot preparation method, comprising:
    dissolving S powder into trioctylphosphine (TOP) to form a first complex solution;
    dissolving ZnO into stearic acid and tri-octylphosphine oxide (TOPO) to form a second complex solution; and
    mixing the first complex solution and the second complex solution to obtain the ZnS quantum dot.

13. A ZnSe quantum dot preparation method, comprising:
    dissolving Se powder into trioctylphosphine (TOP) to form a first complex solution;
    dissolving ZnO into stearic acid and tri-octylphosphine oxide (TOPO) to form a second complex solution; and
    mixing the first complex solution and the second complex solution to obtain the ZnSe quantum dot.

14. A ZnTe quantum dot preparation method, comprising:
    dissolving Te powder into trioctylphosphine (TOP) to form a first complex solution;
    dissolving ZnO into stearic acid and tri-octylphosphine oxide (TOPO) to form a second complex solution; and
    mixing the first complex solution and the second complex solution to obtain the ZnTe quantum dot.

* * * * *